(12) United States Patent
Huang et al.

(10) Patent No.: US 8,987,012 B2
(45) Date of Patent: Mar. 24, 2015

(54) METHOD OF TESTING A SEMICONDUCTOR PACKAGE

(71) Applicant: Siliconware Precision Industries Co., Ltd., Taichung (TW)

(72) Inventors: Pin-Cheng Huang, Taichung (TW);
Chun-Tang Lin, Taichung Hsien (TW);
Wen-Tsung Tseng, Taichung (TW);
Yi-Che Lai, Taichung Hsien (TW)

(73) Assignee: Siliconwave Precision Industries Co., Ltd., Taichung (TW)

(*) Notice: Subject to any disclaimer, the term of this patent is extended or adjusted under 35 U.S.C. 154(b) by 71 days.

(21) Appl. No.: 13/845,698

(22) Filed: Mar. 18, 2013

(65) Prior Publication Data

US 2014/0127838 A1    May 8, 2014

(30) Foreign Application Priority Data

Nov. 5, 2012   (TW) .............................. 101140943 A

(51) Int. Cl.
*H01L 21/66*   (2006.01)

(52) U.S. Cl.
CPC ................ *H01L 22/14* (2013.01); *H01L 22/20* (2013.01); *H01L 2224/16225* (2013.01); *H01L 2224/32225* (2013.01); *H01L 2224/73204* (2013.01); *H01L 2924/15174* (2013.01); *H01L 2924/15311* (2013.01); *H01L 2224/73253* (2013.01)

USPC .......................................................... 438/17

(58) Field of Classification Search
CPC ...................................................... H01L 22/14
USPC .......................................................... 438/17
See application file for complete search history.

(56) References Cited

U.S. PATENT DOCUMENTS

| | | | |
|---|---|---|---|
| 6,372,527 B1* | 4/2002 | Khandros et al. | 438/15 |
| 2010/0233831 A1* | 9/2010 | Pohl et al. | 438/15 |
| 2011/0062592 A1* | 3/2011 | Lee et al. | 257/774 |
| 2012/0104623 A1* | 5/2012 | Pagaila et al. | 257/774 |
| 2013/0120018 A1* | 5/2013 | Hou et al. | 324/762.01 |

* cited by examiner

*Primary Examiner* — Walter H Swanson
(74) *Attorney, Agent, or Firm* — Mintz Levin Cohn Ferris Glovsky and Popeo, P.C.; Peter F. Corless; Steven M. Jensen

(57) ABSTRACT

A method of testing a semiconductor package is provided, including: disposing at least an interposer on a top surface of an adhesive layer, the interposer having a first surface and a second surface opposite to the first surface, a plurality of conductive elements disposed between the second surface of the interposer and the adhesive layer; disposing at least a semiconductor chip on the first surface of the interposer, and performing an electrical test on the semiconductor chip via the conductive elements, wherein if there are a plurality of semiconductor chips that are disposed on the first surface of the interposer, the step of disposing the semiconductor chip and performing the electrical test on the semiconductor chip is iterated; and removing the adhesive layer. By using the method, the fabrication cost and equipment cost of the semiconductor package are reduced, and product yield is increased.

10 Claims, 4 Drawing Sheets

US 8,987,012 B2

METHOD OF TESTING A SEMICONDUCTOR PACKAGE

CROSS-REFERENCES TO RELATED APPLICATIONS

This application claims under 35 U.S.C. §119(a) the benefit of Taiwanese Application No. 101140943, filed Nov. 5, 2012, the entire contents of which is incorporated herein by reference.

BACKGROUND OF THE INVENTION

1. Field of the Invention

This invention relates to semiconductor packages, and, more particularly, to a method of testing a semiconductor package.

2. Description of Related Art

Due to the capabilities of reducing a chip packaging area and shortening a signal transmission path, a flip-chip technique can be applied to a variety of chip packaging fields, such as a chip scale package (CSP), a direct chip attached (DCA) package, and a multi-chip module (MCM) package.

In a flip-chip package fabrication process, since the coefficients of thermal expansion (CTE) of a semiconductor chip and a substrate that is greater than the semiconductor chip in area differ significantly, conductive bumps surrounding the semiconductor chip are in poor electrical contact with electrical contacts disposed on the substrate (since the semiconductor chip has a small size, the conductive bumps are also small in volume, and the attachment between the conductive bumps and the substrate is weak), and are thus likely to be stripped from the substrate.

With the increase of the integrity of integrate circuits disposed on the semiconductor chip, the thermal stress and warpage phenomenon generated due to the mismatch of CTEs of the smaller semiconductor chip and the larger substrate are more and more severe. As a result, the reliability between the semiconductor chip and the substrate is reduced, and a reliability test fails accordingly.

In the prior art, a plurality of chips are disposed on the substrate in a two-dimension manner. The larger the number of the chips is, the greater the area of the substrate becomes, which does not comply with the compact-sized and low-profiled requirements for modern electronic products.

In order to solve the problem, a semiconductor package is brought to the market. As shown in FIG. 1, a plurality of through silicon vias (TSV) 111 are formed in a whole silicon wafer, a redistribution layer 12 is formed on a side of the silicon wafer where a semiconductor chip 14 is to be disposed, solder balls 13 are disposed on the other side of the silicon wafer where a substrate 16 is to be disposed, a singulation process is performed to form a plurality of silicon interposers 11, the semiconductor chip is disposed on the silicon interposers 11 via bumps 18, an underfill 15 is formed between the semiconductor chip 14 and the silicon interposer 11, the silicon interposers 11 are disposed on the substrate 16, an underfill 17 is formed between the silicon interposer 11 and the substrate 16, and a plurality of solder balls 19 are disposed on a bottom surface of the substrate 16 where the silicon interposers 11 are not disposed. Since the silicon interposer 11 and the semiconductor chip 14 are made of similar materials, and the problem due to the mismatch of CTEs is solved. Since both a circuit on a side of the silicon interposer 11 where the semiconductor chip 14 is disposed and contacts or a circuit on the semiconductor chip 14 that are to be connected with the circuit are fabricated by a semiconductor wafer fabrication process, a plurality of the semiconductor chips 14 can be disposed on the silicon interposer 11, with an area not increased. In order to comply with functional design or circuit design requirements, the semiconductor chips are stacked on one another, to comply with the compact-sized and low-profiled requirements for modern electronic products. The underfills 15 and 17 protect the solder balls 13 and the bumps 18 from being contaminated by ambient environment.

Compared with the old technique that disposes a semiconductor chip that has a smaller area on a substrate directly, the semiconductor package uses the silicon interposer 11 as an intermediate board. The silicon interposer 11 is fabricated by a semiconductor process, and can have a line width/line pitch as small as the semiconductor chip 14. Therefore, the semiconductor chip 14 can be disposed on the silicon interposer 11 and connected to the substrate 16, and the overall volume of the semiconductor package is reduced. The small line width/line pitch characteristics of the silicon interposer 11 also correspond to a shortened electrical connection distance. Therefore, the overall electrical transmission speed is increased.

However, in a method of testing a semiconductor package according to the prior art a semiconductor chip 14 is first disposed on the silicon interposer 11 on the substrate 16 and a first electrical test step is then performed via the solder balls 19; and, after the first electrical test step is successful, another semiconductor chip 14 is disposed on the silicon interposer 11 and a second electrical test step is performed, in order to avoid a drawback that both the two semiconductor chips 14 have to be declared to be mal-functional even if only one of the two semiconductor chips 14 cannot pass the electrical test step, because both the two semiconductor chips 15 have been disposed on the silicon interposer 11. Besides, the electrical test steps of the prior art take much time, and, as such, the overall throughput drops.

Therefore, how to solve the problems of the prior art is becoming an urgent issue in the art.

SUMMARY OF THE INVENTION

In diagram of the drawbacks of the prior art, the present invention provides a method of testing a semiconductor package, comprising: disposing at least an interposer on a top surface of an adhesive layer, the interposer having a first surface and a second surface opposite to the first surface, a plurality of conductive elements being disposed between the second surface of the interposer and the adhesive layer; disposing at least a semiconductor chip on the first surface of the interposer, and performing an electrical test on the semiconductor chip via the conductive elements, wherein if there are a plurality of semiconductor chips that are disposed on the first surface of the interposer, the step of disposing the semiconductor chip and performing the electrical test on the semiconductor chip is iterated and removing the adhesive layer.

In an embodiment, prior to performing the electrical test step, the method further comprises forming a plurality of adhesive layer vias for exposing the conductive elements, the adhesive layer vias are formed by thermal cautery removal or mechanical drilling technique, and the thermal cautery removal technique is performed by using laser.

In an embodiment, each of the adhesive layer vias has a radius greater than 25 micrometers and less than 75 micrometers. The method further comprises, after disposing the interposer on the adhesive layer and prior to disposing the semiconductor chip on the interposer, or after performing the electrical test and removing the adhesive layer, performing a singulation step on the interposer. And the method further comprises adhering the bottom surface of the adhesive layer evenly onto a carrier by an air suction force or an electrostatic force.

In an embodiment, the method further comprises, after removing the adhesive layer, attaching the interposer via the conductive elements to a top surface of a substrate, and the interposer is attached to the substrate by reflowing.

In an embodiment, the interposer is made of a silicon-containing material, and has a plurality of conductive perforations interconnecting the semiconductor chip and the conductive elements. The substrate has a plurality of solder balls disposed on a bottom surface thereof, such that the step of performing the electrical test can be subjected to the solder balls.

According to the present invention, since no substrate exists when the electrical test is performed, the interposer and the semiconductor chip can be tested directly. Therefore, bad semiconductor chip or interposer can be detected in an early stage, and the fabrication cost is thus reduced. According to the present invention, the interposer and the semiconductor chip may be considered as a semiconductor chip in a conventional flip-chip fabrication process, and can be fabricated by a conventional flip-chip fabrication machine. Therefore, the equipment cost is also reduced. According to the present invention, the warpage of the interposer is alleviated by planarizing the adhesive layer or providing an un-singulated interposer. Therefore, the yield of the attachment of the semiconductor chip to the interposer is increased.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A-2H are cross-sectional diagrams illustrating a method of testing a semiconductor package according to the present invention.

Figure 1:
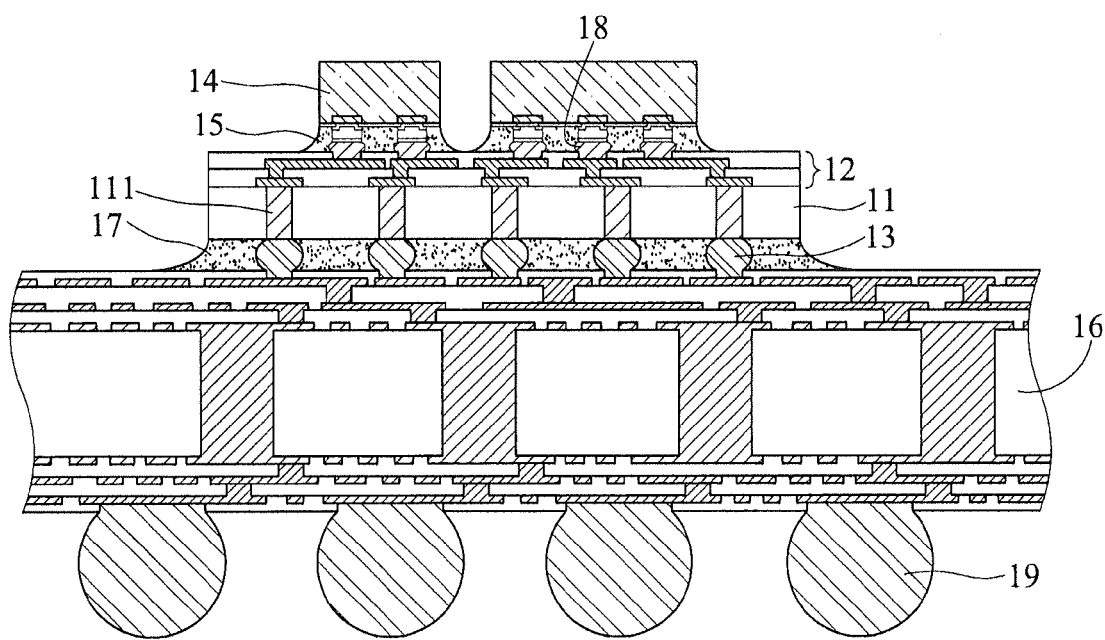
FIG. 1 is a cross-sectional diagram of a semiconductor package according to the prior art.
Figure 2A:
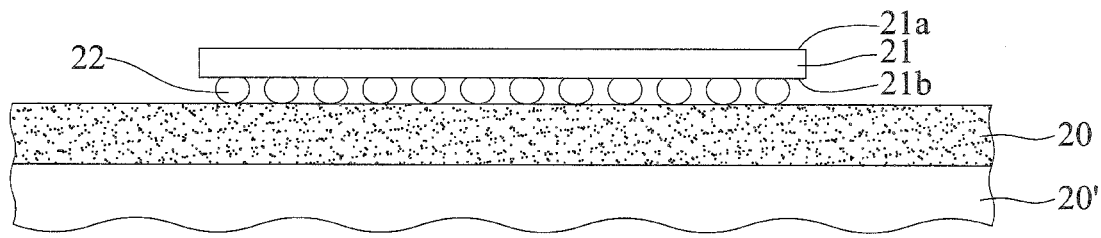
FIGS. 2A-2H are cross-sectional diagrams illustrating a method of testing a semiconductor package according to the present invention.

As shown in FIG. 2A, an interposer 21 is disposed on a top surface of an adhesive layer 20, and has a first surface 21a and a second surface 21b opposite to the first surface 21a. In an embodiment, the interposer 21 is made of a silicon-containing material. A plurality of conductive elements 22 is disposed on the second surface 21b. The interposer 21 is disposed via the conductive elements 22 on the adhesive layer 20. A periphery of the adhesive layer 20 may be attached to a circular ring element (not shown), and a bottom surface of the adhesive layer 20 is adhered to a carrier 20' evenly by an air suction force or an electrostatic force, to keep the adhesive layer 20 flat and increase the yield of subsequent processes.

Figure 2B:
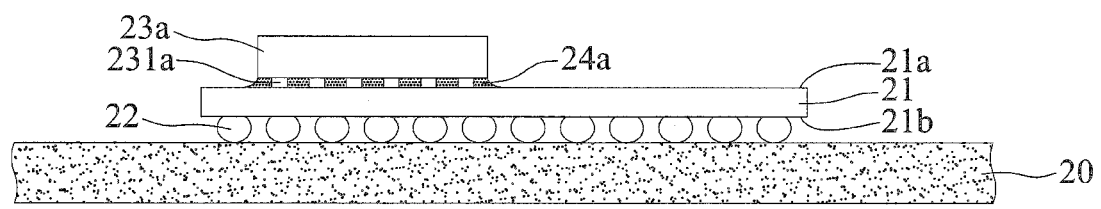
Figure 2B:
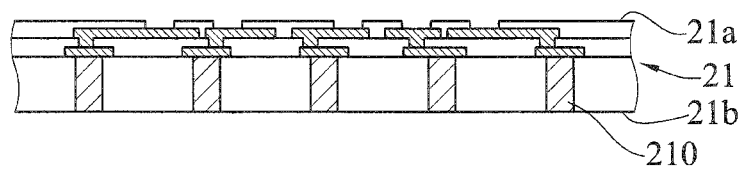

As shown in FIGS. 2B and 2B', a semiconductor chip 23a is disposed on the first surface 21a of the interposer 21. A plurality of conductive perforations 210 is formed in the interposer 21 and connected to the semiconductor chip 23a and the conductive elements 22. A plurality of metal bumps 231a are disposed on the semiconductor chip 23a and electrically connected to the interposer 21. An underfill material 24a, such as a capillary underfill or a non-conductive paste (NCP), is formed between the interposer 21 and the semiconductor chip 23a. The metal bumps 231a disposed on the semiconductor chip 23a are bonded to bump pads disposed on the interposer 21 by a thermal compression bonding (TCB) process. Solder paste (not shown) on the metal bumps 231a are fused and bonded to the bump pads on the interposer 21 in a reflow step of a conventional flip-chip process, and an inter-metallic compound (IMC)(not shown) is generated.

Figure 2C:
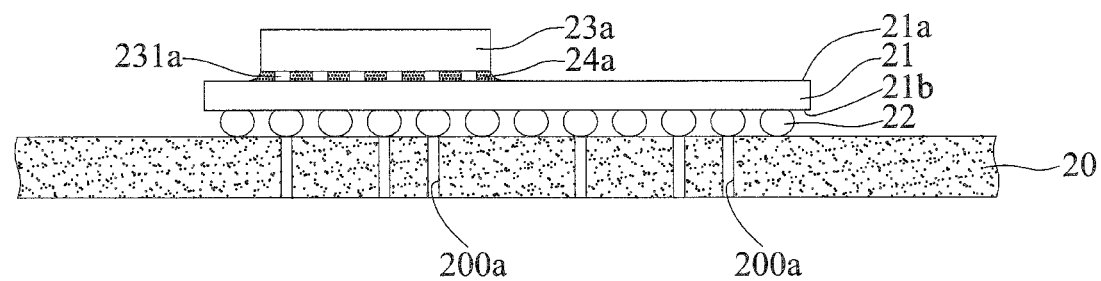

As shown in FIG. 2C, a plurality of adhesive layer vias 200a for exposing the conductive elements 22 is formed. In an embodiment, the adhesive layer vias 200a are formed by thermal cautery removal or mechanical drilling technique, and the thermal cautery removal is performed by using laser. The adhesive layer vias 200a each have a radius greater than 25 micrometers, for allowing electrical test probes to pass therethrough, and less than 75 micrometers, to avoid the conductive elements 22 from dropping therein.

Figure 2D:
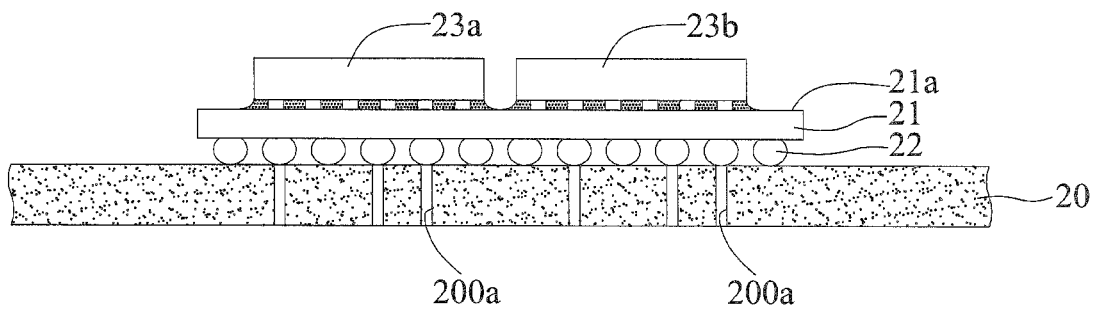

As shown in FIG. 2D, steps shown in FIG. 2B are iterated, to dispose another semiconductor chip 23b on the first surface 21a of the interposer 21.

Figure 2E:
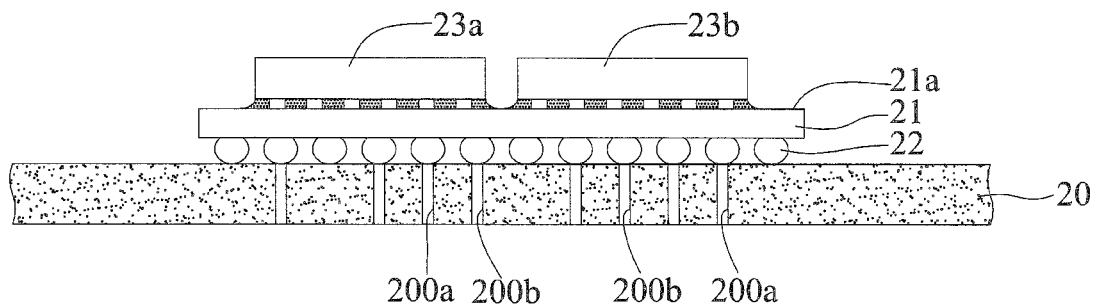

As shown in FIG. 2E, steps shown in FIG. 2C are iterated, to form another adhesive layer vias 200b that expose the conductive elements 22.

Figure 2F:
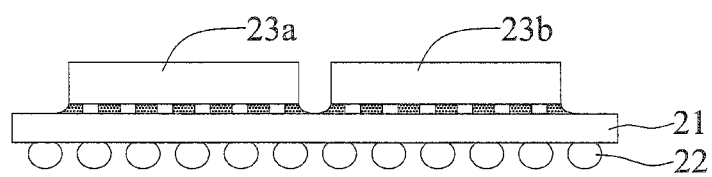

As shown in FIG. 2F, the adhesive property of the adhesive layer 20 is destroyed or reduced by thermal, chemical or mechanical technique, and the adhesive layer 20 is then removed.

Figure 2G:
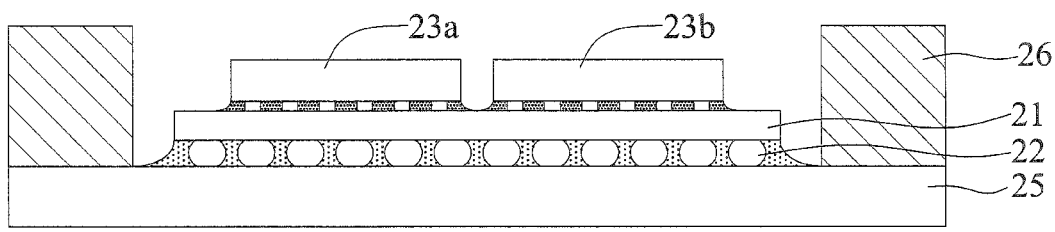

As shown in FIG. 2G, the interposer 21 is bonded via the conductive elements 22 to a top surface of a substrate 25 by a reflow step in a conventional flip-chip process. A frame 26 is disposed on the top surface of the substrate 25 and surrounds the interposer 21. During the bonding of the interposer 21 to the substrate 25, an ambient environment is kept above 100° C. such that the warpage of the substrate 25 is reduced effectively.

Figure 2H:
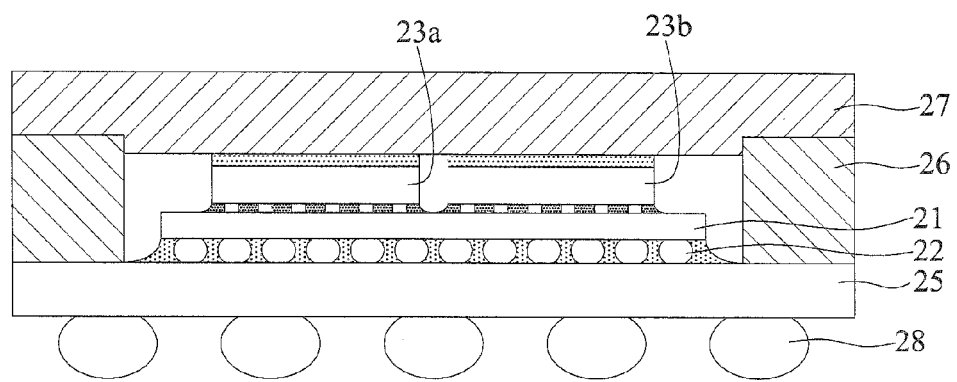

As shown in FIG. 2H, a cover 27 connected to the top surfaces of the semiconductor chips 23a and 23b is disposed on the frame 26. The frame 26 and the cover 27 act as a heat-dissipating component that dissipates heat generated by the semiconductor chips 23a and 23b to external environment. Then, a plurality of solder balls 28 are disposed on a bottom surface of the substrate 25, and an electrical test is performed via the solder balls 28 (e.g., by contacting the solder balls 28 with an electrical test probe).

In an embodiment, the interposers 21 are singulated. In another embodiment, an interposer 21 that is not singulated yet is disposed on the adhesive layer 20, and steps shown in FIG. 2F are performed, i.e., performing a singulation process on the interposer 21. In yet another embodiment, the singulation process is performed on the interposer 21 after the interposer 21 is disposed on the adhesive layer 20 and the semiconductor chips 23a and 23b are disposed on the interposer 21, or after the electrical test step is performed and before the adhesive layer 20 is removed.

Compared with the prior art, since no substrate exists when the electrical test step is performed, the interposer and the semiconductor chip can be tested directly. Therefore, bad semiconductor chip or interposer can be detected in an early stage, and the fabrication cost is thus reduced. According to the present invention, the interposer and the semiconductor chip may be considered as a semiconductor chip in a conventional flip-chip fabrication process, and can be fabricated by a conventional flip-chip fabrication machine Therefore, the equipment cost is also reduced. According to the present invention, the warpage of the interposer is alleviated by planarizing the adhesive layer or providing an un-singulated interposer. Therefore, the yield of the attachment of the semiconductor chip to the interposer is increased.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of testing a semiconductor package, comprising:
    disposing at least an interposer on a top surface of an adhesive layer, the interposer having a first surface and a second surface opposite to the first surface, a plurality of conductive elements being disposed between the second surface of the interposer and the adhesive layer;
    forming a plurality of adhesive layer vias for exposing a portion of the conductive elements;
    disposing at least a semiconductor chip on the first surface of the interposer, and performing an electrical test on the semiconductor chip via the conductive elements, wherein if there are a plurality of semiconductor chips that are disposed on the first surface of the interposer, the step of disposing the semiconductor chip and the step of performing the electrical test on the semiconductor chip are iterated; and
    removing the adhesive layer.

2. The method of claim 1, wherein the adhesive layer vias are formed by thermal cautery removal or mechanical drilling technique.

3. The method of claim 2, wherein the thermal cautery removal technique is performed by using laser.

4. The method of claim 1, wherein the adhesive layer vias have a radius greater than 25 micrometers and less than 75 micrometers.

5. The method of claim 1, further comprising, after the step of disposing the interposer on the adhesive layer and prior to the step of disposing the semiconductor chip on the interposer, or after the step of performing the electrical test step and the step of removing the adhesive layer, performing a singulation step on the interposer.

6. The method of claim 1, further comprising adhering a bottom surface of the adhesive layer evenly onto a carrier by an air suction force or an electrostatic force.

7. The method of claim 1, further comprising, after the step of removing the adhesive layer, attaching the interposer via the conductive elements to a top surface of a substrate.

8. The method of claim 7, wherein the interposer is attached to the substrate by reflowing.

9. The method of claim 7, wherein the substrate has a plurality of solder balls disposed on a bottom surface thereof, and the method further comprising performing the electrical test via the solder balls.

10. The method of claim 1, wherein the interposer is made of a silicon-containing material, and has a plurality of conductive perforations interconnecting the semiconductor chip and the conductive elements.

\* \* \* \* \*